May 2, 1961 H. M. GORDY 2,982,883

ELECTRICAL COMPONENT LOCKING ARRANGEMENT

Filed Aug. 23, 1957

INVENTOR.
HAROLD M. GORDY,
BY
Donald L. Royer
AGENT

United States Patent Office 2,982,883

Patented May 2, 1961

2,982,883

ELECTRICAL COMPONENT LOCKING ARRANGEMENT

Harold M. Gordy, Los Angeles, Calif., assignor to Hughes Aircraft Company, Culver City, Calif., a corporation of Delaware Filed Aug. 23, 1957, Ser. No. 680,378

9 Claims. (Cl. 317—101)

This invention finds particular utility in connection with printed circuits and relates particularly to an apparatus for securing electrical components to printed circuits or the like.

Most electrical components that are secured to printed circuit boards have metallic leads disposed from opposite ends thereof. Heretofore it has been the practice to dispose these leads through holes or eyelets in the circuit board or to wrap the leads about standoffs or terminals. Thereafter, the leads were either soldered to the terminals or within the holes in the board. In many instances, especially in connection with electrical circuits wherein extreme reliability, efficiency and accuracy are required, it is important that close tolerance components be utilized and that the handling of these components such as, for example, condensers, capacitors, resistors and the like, be in such a manner whereby to retain the electrical characteristics of the components. The application of heat to the leads of these components, as when applying solder thereto, often changes the electrical values thereof.

In the application of electrical components to printed circuit boards, it is common practice first to bend the leads at the proper length, insert the leads within the holes or about terminals and then to apply solder thereto. The soldering operation is not only time consuming but also produces the possibility of a cold soldered joint which prevents adequate electrical transmission characteristics. Furthermore, in printed circuits wherein the components are soldered in place, if it becomes necessary to replace one or more of the components thereon, considerable time is consumed in removing the solder connection and components and thereafter inserting a new component together with making a further solder joint.

Accordingly, it is one object of the present invention to provide a printed circuit board having novel means for securing electrical components thereto.

It is a further important object of the invention to provide a printed circuit board having means for securing components in association with electrical circuits on said boards, such means requiring no solder joints.

Another object of the invention is to provide a means for attaching components to printed circuit boards wherein such components are rapidly and easily attached thereto and/or removed therefrom.

Still another object of the invention is to provide a printed circuit board and component attachment means therefor that is efficient in operation, reliable in use and wherein component attachment time is reduced to a minimum.

Other and further important objects of the invention will become apparent from the disclosures in the following detailed specification, appended claims and accompanying drawing, wherein:

Figure 1:
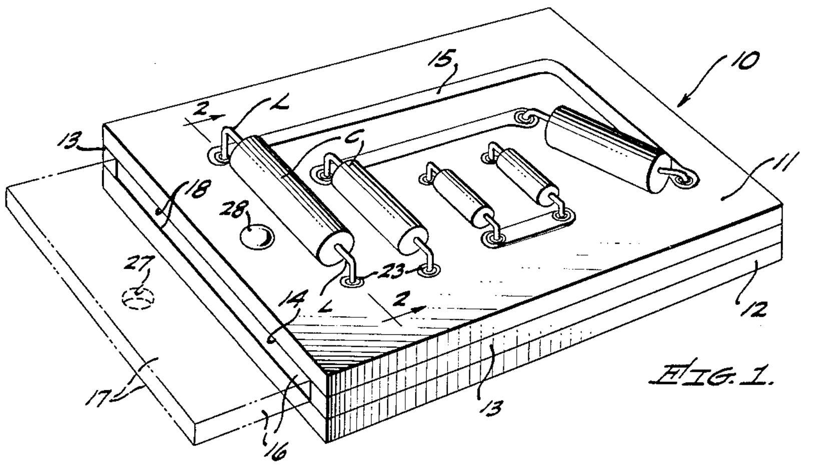
Figure 1 is a perspective view showing the present circuit board with electrical components attached thereto.

With reference to the drawing, the printed circuit board hereof is indicated generally at 10. The board 10 includes outer sheets 11 and 12 that may be secured together by any suitable means such as an adhesive along outer lateral edges and disposed in spaced relationship by means of elongated spacers 13, thus to define a passage or elongated slot 14 therebetween. The sheets 11 and 12 may be made from any suitable insulating material. The sheets 11 and 12 may further be provided with any suitable printed circuit pattern as indicated at 15 and this circuit pattern may be on either one or the other of the sheets 11 or 12 or, if desired, on both of these sheets. A slide member 16, also of insulating material, is disposed for slidable movement in the passageway 14 with outer surfaces 17 of the slide member 16 preferably being in intimate contact with inner surfaces 18 of the sheets 11 and 12.

Figures 2, 3, 4, 5, 6:
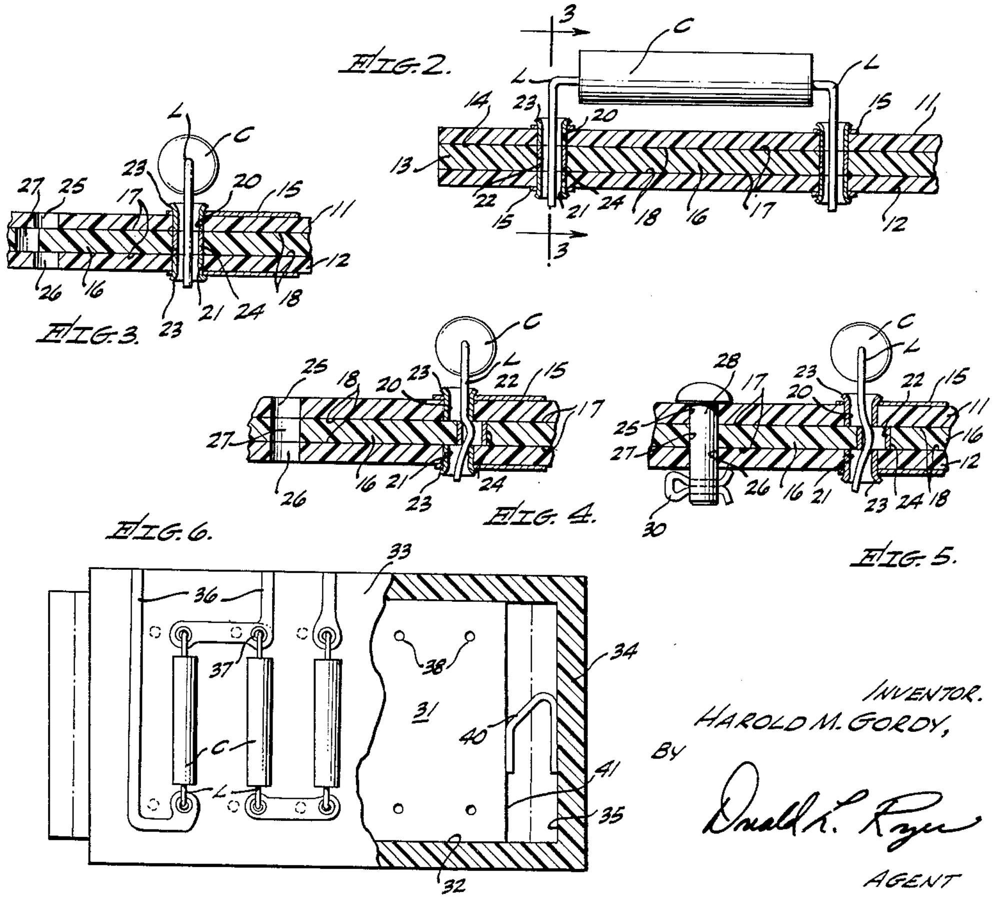
Fig. 2 is an enlarged fragmentary sectional view through attachment points of one electrical component and as taken substantially as indicated by line 2—2, Fig. 1.
Fig. 3 is a transverse sectional view taken substantially as indicated by line 3—3, Fig. 2, and showing a component lead following insertion in an opening in the circuit board and prior to securing therein.
Figs. 4 and 5 are views similar to Fig. 3 showing elements of the present circuit board and component leads in different positions and as secured to the circuit boards.
Fig. 6 is a top plan view of a modified form of printed circuit board having component attachment means in accordance with the present invention.

With reference to Figs. 2 and 3, the sheets 11 and 12 are provided respectively with a pattern of a plurality of aligned holes 20 and 21. Additionally, the slide member 16 is provided with a plurality of holes 22 that are disposed in substantially the same pattern as the holes 20 and 21, but which are displaced in the direction of movement of the member 16 in the passageway 14. In order to provide an electrical path within the holes 20, 21 and 22, the holes 20 and 21 are fitted with tubular metallic shims or eyelets 23 and the holes 22 are fitted with suitable metallic tubular members 24. The eyelets 23 normally extend beyond an outer surface of the circuit 15 and may be deformed thereover and soldered thereto.

In use of the present device, the member 16 is positioned within the passageway 14 in such a manner as to align the tubular members 24 in the holes 22 with the eyelets 23 in the holes 20 and 21. Thereafter, leads L of a component C are bent at proper positions and inserted within the eyelets 23 and aligned members 24, with the structure thus being in the position shown in Fig. 3. The slide member 16 is thereafter moved longitudinally within the passageway 14 and to the position shown in Figs. 4 and 5, thus to clamp the leads L within the eyelets 23 and tubular members 24, to retain the component to the board and establish firm electrical contact between the leads and the circuit pattern 15.

With reference to Figs. 3 and 4, it is to be noted that the sheets 11 and 12 are each provided with additional openings 25 and 26 respectively and that the slide member 16 is provided with an opening 27. When the slide member 16 is positioned as shown in Fig. 3 and with the eyelets 23 aligned with the members 24, the hole 27 is misaligned with respect to the openings 25 and 26. However, when the slide member 16 is positioned as shown in Figs. 4 and 5, the hole 27 will be in alignment with the holes 25 and 26 and, as shown in Fig. 5, a pin 28 may be disposed therethrough, whereby to lock the slide member 16 in position relative to the sheets 11 and 12 and secure the component leads L therein. The pin 28 may be held in position by any suitable means such as, for example, a cotter pin 30.

It is to be noted that the leads L are held tightly in position by means of a combination of shear and bending forces and that removal of any or all of the components from the sheet 16 may be accomplished by merely removing the pin 28 and realigning the tubular members 24 with the eyelets 23. The leads L of the various components may either all be of similar diameter or may be of different diameters, the lateral pattern spacing between the holes in the sheets 11 and 12 and the slide member 16 being such as to accommodate various diameter leads as predetermined in the design of the particular hole spacing. In any event, it is to be noted that all of the component leads will be securely locked in position, retained in and to the circuit boards and disposed in firm electrical contact with the circuits 15.

For some purposes, the eyelets 23 and the tubular members 24 may be eliminated, an electrical path through the holes 20, 21 and 22 being made by metallic plating of the surfaces of these holes and bonding this plating to the circuit 15. In this case, the leads L are disposed in contact with the plating in the holes.

With reference to Fig. 6, it is to be noted that an alternative form of the invention is shown wherein a slide member 31 is slidably positioned within a slot 32 of a double sided outer body 33. One end of the slot 33 is closed by a wall 34 having an inner surface 35. The body 33 has outer surfaces on which a printed circuit pattern 36 is disposed and in which a pattern of holes 37 is formed. The slide member 31 is also provided with a pattern of holes 38 that are normally laterally displaced with respect to the holes 37. A leaf spring 40 is disposed within the inner end of the slot 32 and acts between the inner surface 35 of the wall 34 and an inner end 41 of the slide member 31. The spring 34 normally biases the slide member 31 in a direction toward misalignment of the holes 38 with respect to the holes 37. Thus, the slide member 31 is first moved against the force of the spring 40 to align the holes 38 with the holes 37 and the leads L of component C are disposed within the aligned holes. Thereafter, the force of the leaf spring 40 will move the slide member 31 in a direction to secure the leads L within the holes 37 and 38 to secure the components to the board and establish the desired electrical continuity between the leads and the circuit pattern 36.

It may thus be seen that means has been provided to secure electrical components to printed circuit boards in a rapid and efficient manner and without the use of solder in connection therewith. Additionally, the components are securely retained in position and may be replaced at will in a simple and easy manner and requiring only a minimum amount of time.

Having thus described the invention and the present embodiments thereof, it is desired to emphasize the fact that many further modifications may be resorted to in a manner limited only by a just interpretation of the following claims.

I claim:

1. In an apparatus for securing electrical components to printed circuit boards: adjacently disposed multiple board means; means for movably retaining said board means in surface contacting relationship; circuit means carried by said board means; a substantially identical pattern of holes in all elements of said board means; means for establishing an electrical path through said holes, leads of said components being adapted for disposition in said holes, relative movement of portions of said board means disposing said pattern of holes in a misaligned position whereby to secure said component leads therein; and means for retaining said portions of said board means in said hole pattern misaligned position.

2. In an apparatus for securing electrical components to printed circuit boards: adjacently disposed multiple board means; means for movably retaining said board means in surface contacting relationship; circuit means carried by said board means; a substantially identical pattern of holes in all elements of said board means; eyelet means disposed in said holes and contacting said circuit means for establishing an electrical path through said holes, leads of said components being adapted for disposition in said holes and contact with said eyelet means, relative movement of portions of said board means disposing said pattern of holes in a misaligned position whereby to secure said component leads therein; and means for retaining said portions of said board means in said hole pattern misaligned position.

3. An apparatus for securing electrical components to printed circuit boards comprising, in combination: a pair of spaced sheets of insulating material, at least one of said sheets having a printed circuit thereon; means to dispose and retain said sheets in spaced relationship to each other; an aligned pattern of holes through said sheets, said holes being cooperatively disposed relative to said circuit; a slide member positioned between said sheets; a hole pattern in said slide member and substantially identical to said aligned hole pattern in said sheets, said hole pattern in said slide member being adapted for misalignment in one direction relative to said hole pattern in said sheets; means defining an electrical path between a surface of said holes and said printed circuit, leads of said components being adapted for disposition in said holes in said sheets and said slide member, relative movement of said slide member toward said misalignments of said hole pattern therein being adapted to secure said leads in said holes and in electrical contact with said printed circuit; and means for retaining said slide member in said hole misaligned relationship with said sheets.

4. An apparatus for securing electrical components to printed circuit boards comprising, in combination: a pair of spaced sheets of insulating material, at least one of said sheets having a printed circuit thereon; means to dispose and retain said sheets in spaced relationship to each other; an aligned pattern of holes through said sheets, said holes being cooperatively disposed relative to said circuit; a slide member positioned between said sheets; a hole pattern in said slide member and substantially identical to said aligned hole pattern in said sheets, said hole pattern in said slide member being adapted for misalignment in one direction relative to said hole pattern in said sheets; eyelet means disposed in said holes in at least said sheets and defining an electrical path between a surface of said holes and said printed circuit, leads of said components being adapted for disposition in said holes and contact with said eyelet means in said sheets and said slide member, relative movement of said slide member toward said misalignments of said hole pattern therein being adapted to secure said leads in said holes and in electrical contact with said printed circuit; and means for retaining said slide member in said hole misaligned relationship with said sheets.

5. An apparatus for securing electrical components to printed circuit boards comprising, in combination: a pair spaced sheets of insulating material, at least one of said sheets having a printed circuit thereon; means to dispose and retain said sheets in spaced relationship to each other; an aligned pattern of holes through said sheets, said holes being cooperatively disposed relative to said circuit; a slide member positioned between said sheets; a hole pattern in said slide member and substantially identical to said aligned hole pattern in said sheets, said hole pattern in said slide member being adapted for misalignment in one direction relative to said hole pattern in said sheets; means defining an electrical path between a surface of said holes and said printed circuit, leads of said components being adapted for disposition in said holes in said sheets and said slide member, relative movement of said slide member toward said misalignments of said hole pattern therein being adapted to secure said leads in said holes and in electrical contact with said printed circuit; and pin means disposed in openings in said sheets and said slide member for retaining said slide member in said hole misaligned relationship with said sheets.

6. An apparatus for securing electrical components to printed circuit boards comprising, in combination: a pair spaced sheets of insulating material, at least one of said sheets having a printed circuit thereon; spacer means to dispose and retain said sheets in spaced relationship to each other; an aligned pattern of holes through said sheets, said holes being cooperatively disposed relative to said circuit; a slide member positioned between said sheets and having surfaces disposed in intimate contact with surfaces of said sheets; a hole pattern in said slide member and substantially identical to said aligned hole pattern in said sheets, said hole pattern in said slide member being adapted for misalignment in one direction relative to said hole pattern in said sheets; means defining an electrical path between a surface of said holes and said printed circuit, leads of said components being adapted for disposition in said holes in said sheets and said slide member, relative movement of said slide member toward said misalignments of said hole pattern therein being adapted to secure said leads in said holes and in electrical contact with said printed circuit; and means for retaining said slide member in said hole misaligned relationship with said sheets.

7. An apparatus for securing electrical components to printed circuit boards comprising, in combination: a pair of spaced sheets of insulating material, at least one of said sheets having a printed circuit thereon; spacer means to dispose and retain said sheets in spaced relationship to each other; an aligned pattern of holes through said sheets, said holes being cooperatively disposed relative to said circuit; a slide member positioned between said sheets and having surfaces disposed in intimate contact with surfaces of said sheets; a hole pattern in said slide member and substantially identical to said aligned hole pattern in said sheets, said hole pattern in said slide member being adapted for misalignment in one direction relative to said hole pattern in said sheets; means defining an electrical path between a surface of said holes and said printed circuit, leads of said components being adapted for disposition in said holes in said sheets and said slide member, relative movement of said slide member toward said misalignments of said hole pattern therein being adapted to secure said leads in said holes and in electrical contact with said printed circuit; and pin means disposed in openings in said sheets and said slide member for retaining said slide member in said hole misaligned relationship with said sheets.

8. An apparatus for securing electrical components to printed circuit boards comprising, in combination: a pair of spaced sheets of insulating material, at least one of said sheets having a printed circuit thereon; spacer means to dispose and retain said sheets in spaced relationship to each other; an aligned pattern of holes through said sheets, said holes being cooperatively disposed relative to said circuit; a slide member positioned between said sheets and having surfaces disposed in intimate contact with surfaces of said sheets; a hole pattern in said slide member and substantially identical to said aligned hole pattern in said sheets, said hole pattern in said slide member being adapted for misalignment in one direction relative to said hole pattern in said sheets; eyelet means disposed in said holes in at least said sheets and defining an electrical path between a surface of said holes and said printed circuit, leads of said components being adapted for disposition in said holes and contact with said eyelet means in said sheets and said slide member, relative movement of said slide member toward said misalignments of said hole pattern therein being adapted to secure said leads in said holes and in electrical contact with said printed circuit; and pin means disposed in openings in said sheets and said slide member for retaining said slide member in said hole misaligned relationship with said sheets.

9. An apparatus for securing electrical components to printed circuit boards comprising, in combination: a pair of spaced sheets of insulating material, at least one of said sheets having a printed circuit thereon; means to dispose and retain said sheets in spaced relationship to each other; and aligned pattern of holes through said sheets, said holes being cooperatively disposed relative to said circuit; a slide member positioned between said sheets; a hole pattern in said slide member and substantially identical to said aligned hole pattern in said sheets, said hole pattern in said slide member being adapted for misalignment in one direction relative to said hole pattern in said sheets; eyelet means disposed in said holes in at least said sheets and defining an electrical path between a surface of said holes and said printed circuit, leads of said components being adapted for disposition in said holes and contact with said eyelet means in said sheets and said slide member, relative movement of said slide member toward said misalignments of said hole pattern therein being adapted to secure said leads in said holes and in electrical contact with said printed circuit; and leaf spring means disposed between said slide member and said sheets for biasing said slide member in a direction to retain said slide member in said hole misaligned relationship with said sheets.

References Cited in the file of this patent

UNITED STATES PATENTS

| | | |
|---|---|---|
| 1,691,877 | Alden | Nov. 13, 1928 |
| 2,453,734 | Teetsell | Nov. 16, 1948 |
| 2,502,291 | Taylor | Mar. 28, 1950 |
| 2,586,854 | Myers | Feb. 26, 1952 |
| 2,738,479 | Gibson | Mar. 13, 1956 |

FOREIGN PATENTS

| | | |
|---|---|---|
| 953,773 | France | Dec. 13, 1949 |